(12) United States Patent
Cho et al.

(10) Patent No.: US 11,443,997 B2
(45) Date of Patent: Sep. 13, 2022

(54) SEMICONDUCTOR PACKAGE AND METHOD OF MANUFACTURING THE SAME

(71) Applicant: Advanced Semiconductor Engineering, Inc., Kaohsiung (TW)

(72) Inventors: Wei Chih Cho, Kaohsiung (TW); Chun Chen Chen, Kaohsiung (TW); Shao-Lun Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/933,806

(22) Filed: Jul. 20, 2020

(65) Prior Publication Data

US 2022/0020654 A1 Jan. 20, 2022

(51) Int. Cl.
| | |
|---|---|
| *H01L 23/31* | (2006.01) |
| *H01L 23/498* | (2006.01) |
| *H01L 23/00* | (2006.01) |
| *H01L 21/56* | (2006.01) |
| *H01L 25/00* | (2006.01) |
| *H01L 25/18* | (2006.01) |
| *H01L 25/065* | (2006.01) |

(52) U.S. Cl.
CPC .......... *H01L 23/3135* (2013.01); *H01L 21/56* (2013.01); *H01L 23/3185* (2013.01); *H01L 23/49811* (2013.01); *H01L 23/49833* (2013.01); *H01L 24/16* (2013.01); *H01L 24/17* (2013.01); *H01L 25/0657* (2013.01); *H01L 25/18* (2013.01); *H01L 25/50* (2013.01); *H01L 2224/16145* (2013.01); *H01L 2224/16227* (2013.01); *H01L 2224/16265* (2013.01); *H01L 2224/17181* (2013.01); *H01L 2225/06513* (2013.01); *H01L 2225/06582* (2013.01)

(58) Field of Classification Search
CPC . H01L 23/3135; H01L 21/56; H01L 23/3185; H01L 24/16; H01L 24/17; H01L 2224/16227
See application file for complete search history.

(56) References Cited

U.S. PATENT DOCUMENTS

| | | | | |
|---|---|---|---|---|
| 7,985,628 B2 * | 7/2011 | Kuan | ............... | H01L 21/565 |
| | | | | 438/124 |
| 8,084,849 B2 * | 12/2011 | Chow | ............... | H01L 21/565 |
| | | | | 257/678 |
| 8,432,025 B2 | 4/2013 | Saeki | | |
| 8,536,692 B2 * | 9/2013 | Kuan | ............... | H01L 25/105 |
| | | | | 257/686 |

(Continued)

*Primary Examiner* — Nicholas J Tobergte
(74) *Attorney, Agent, or Firm* — Foley & Lardner LLP

(57) ABSTRACT

A semiconductor package and a method of manufacturing the same are provided. The semiconductor package includes a first substrate, a second substrate, and a barrier structure. The first substrate has a first surface and a second surface opposite to the first surface. The second substrate has a first surface facing the second surface of the first substrate. The first substrate electrically bonds to the second substrate through a conductive terminal disposed between the second surface of the first substrate and the first surface of the second substrate. The barrier structure is disposed adjacent to the first surface of the first substrate.

16 Claims, 6 Drawing Sheets

(56) References Cited

U.S. PATENT DOCUMENTS

| | | | |
|---|---|---|---|
| 2009/0155960 A1* | 6/2009 | Chow | H01L 25/03 438/127 |
| 2010/0078791 A1* | 4/2010 | Yim | H01L 25/0655 257/686 |
| 2013/0119529 A1* | 5/2013 | Lin | H01L 23/3675 257/704 |
| 2015/0262900 A1* | 9/2015 | Wang | H01L 21/563 257/704 |
| 2019/0088621 A1 | 3/2019 | Yang et al. | |

* cited by examiner

SEMICONDUCTOR PACKAGE AND METHOD OF MANUFACTURING THE SAME

BACKGROUND

1. Technical Field

The present disclosure relates to a semiconductor package, and a method of manufacturing the same, and more particularly, to a semiconductor package, and a method of manufacturing the same that can improve reliability of internal electrical connections.

2. Description of the Related Art

Nowadays, techniques for incorporating more than one semiconductor substrates into a single semiconductor package to provide more functions are under progressively development. One semiconductor substrate (such as a unit substrate) may be stacked onto another and a molding process may be performed to encapsulant the semiconductor substrates. Therefore, there is a desire to prevent contaminants resulted from a molding material from entering the electric connection area of a semiconductor substrate. It would be therefore desirable to provide semiconductor packages that can ease the contamination problem of an electrical area of a semiconductor substrate and at the same time satisfy the miniaturization requirement.

SUMMARY

In an aspect, a semiconductor package includes a first substrate, a second substrate, and a barrier structure. The first substrate has a first surface and a second surface opposite to the first surface. The second substrate has a first surface facing the second surface of the first substrate. The first substrate electrically bonds to the second substrate through a conductive terminal disposed between the second surface of the first substrate and the first surface of the second substrate. The barrier structure is disposed adjacent to the first surface of the first substrate.

In an aspect, a method of manufacturing a semiconductor package includes: providing a first substrate having a first surface and a second surface opposite to the first surface; disposing a barrier structure adjacent to the first surface of the first substrate; providing a second substrate having a first surface facing the second surface of the first substrate; disposing a conductive terminal between the first substrate and the second substrate to bond the first substrate to the second substrate; and disposing a first molding layer between the first substrate and the second substrate.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor package including a first substrate and a second substrate. The first substrate has a first surface and a second surface opposite to the first surface. The first substrate electrically bonds to the second substrate through the second surface of the first substrate. A barrier structure is disposed adjacent to the first surface of the first substrate and surrounds an electrical connection area of the first surface of the first substrate so when a molding compound and a filler flow through the space between the first substrate and the second substrate, they will be barred by the barrier structure and cannot reach the electrical connection area.

Figure 1:
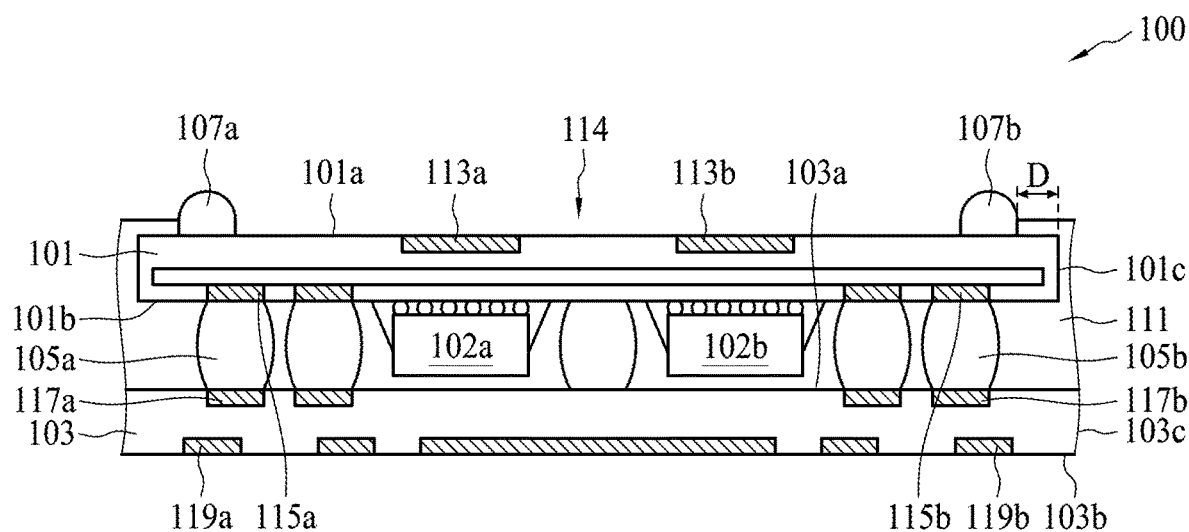
FIG. 1 illustrates a cross-sectional view of a semiconductor package according to some embodiments of the present disclosure.

FIG. 1 illustrates a cross-sectional view of a semiconductor package 100 according to some embodiments of the present disclosure. The semiconductor package 100 of FIG. 1 includes a first substrate 101, a second substrate 103, and a barrier structure 107a, 107b.

The first substrate 101 has a first surface 101a, a second surface 101b opposite to the first surface 101a, and a side surface 101c extending from the first surface 101a to the second surface 101b. The first substrate 101 may have a projection area smaller than or substantially equal to that of the second substrate. In some embodiments, the first substrate 101 is a unit substrate and has a projection area smaller than that of the corresponding second unit substrate 103 so as to provide more space above the first substrate 101 to accommodate more molding compounds and fillers so less molding flux may flow over the barrier structure 107a, 107b and contaminate the electrical connection area 114 of the first surface 101a of the first substrate 101.

The first substrate 101 may be a printed circuit board, a unit substrate, a strip substrate, or a combination thereof. A unit substrate may include, for example, a unit chip (e.g., a communication chip, a microprocessor chip, a graphics chip, or a microelectromechanical systems (MEMS) chip diced from a wafer), a unit package, a unit interposer, or a combination thereof. A strip substrate may include, for example, a plurality of unit substrates, unit chips (e.g., communication chips, microprocessor chips, graphics chips, or microelectromechanical systems (MEMS) chips diced from a wafer), unit packages, unit interposers, or a combination thereof. In some embodiments, the first substrate 101 is a unit substrate. In some embodiments, the first substrate 101 is a unit substrate after singularizing.

The first substrate 101 may include at least one first pad 115a, 115b. The first pad 115a, 115b may be disposed adjacent to the second surface 101b of the first substrate 101. In some embodiments, the first pad 115a, 115b is disposed on (e.g., physical contact or embedded in and exposed by) the second surface 101b of the first substrate 101. The first pad 115a, 115b may be, for example, a contact pad of a trace or a ball pad. In some embodiments, the first pad 115a, 115b is a ball pad. The first pad 115a, 115b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first substrate 101 may further include an electrical connection area 114 for providing external electrical connections. The electrical connection area 114 may be disposed adjacent to the first surface 101a of the first substrate 101. The electrical connection area 114 may be disposed adjacent to a center of the first surface 101a of the first substrate 101. The electrical connection area 114 may include at least one second pad 113a, 113b. The second pad 113a, 113b may be, for example, a contact pad of a trace or a ball pad. In some embodiments, the second pad 113a, 113b is a contact pad of a trace. The second pad 113a, 113b may include, for example, one of, or a combination of, copper, gold, indium, tin, silver, palladium, osmium, iridium, ruthenium, titanium, magnesium, aluminum, cobalt, nickel, or zinc, or other metals or metal alloys.

At least one first electronic component 102a, 102b may be further disposed adjacent to the second surface 101b of the first substrate 101. The first electronic component 102a, 102b may electrically connect to the second surface 101b of the first substrate 101. The first electronic component 102a, 102b may electrically connect to the second surface 101b of the first substrate 101 through an electrical connector (e.g., a pillar or a solder/stud bump). The first electronic component 102a, 102b may include an active component (e.g., a die or a chip) and a passive component (e.g., a capacitor, an inductor, or a resistor). In some embodiments, at least one of the first electronic components 102a, 102b is a passive component and at least one of the first electronic components 102a, 102b is an active component. In some embodiments, only active components 102a, 102b are disposed adjacent to the second surface 101b of the first substrate 101. In some embodiments, only passive components 102a, 102b are disposed adjacent to the second surface 101b of the first substrate 101.

The second substrate 103 has a first surface 103a and a second surface 103b opposite to the first surface 103a. The second substrate 103 may be a printed circuit board, a unit substrate, a strip substrate, or a combination thereof. A unit substrate may include, for example, a unit chip (e.g., a communication chip, a microprocessor chip, a graphics chip, or a microelectromechanical systems (MEMS) chip diced from a wafer), a unit package, a unit interposer, or a combination thereof. A strip substrate may include, for example, a plurality of unit substrates, unit chips (e.g., communication chips, microprocessor chips, graphics chips, or microelectromechanical systems (MEMS) chips diced from a wafer), unit packages, unit interposers, or a combination thereof. In some embodiments, the second substrate 103 is a strip substrate.

The second substrate 103 may include at least one first pad 117a, 117b. The first pad 117a, 117b may be disposed adjacent to the first surface 103a of the second substrate 103. In some embodiments, the first pad 117a, 117b is disposed on (e.g., physical contact or embedded in and exposed by) the first surface 103a of the second substrate 103. The first pad 117a, 117b of the second substrate 103 may be, for example, a contact pad of a trace or a ball pad. In some embodiments, the first pad 117a, 117b of the second substrate 103 is a ball pad. The first pad 117a, 117b of the second substrate 103 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The second substrate 103 may further include at least one second pad 119a, 119b. The second pad 119a, 119b may be disposed adjacent to the second surface 103b of the second substrate 103. In some embodiments, the second pad 119a, 119b is disposed on (e.g., physical contact or embedded in and exposed by) the second surface 103b of the second substrate 103. The second pad 119a, 119b of the second substrate 103 may be, for example, a contact pad of a trace or a ball pad. In some embodiments, the second pad 119a, 119b of the second substrate 103 is a ball pad. The second pad 119a, 119b of the second substrate 103 may include, for example, one of, or a combination of, copper, gold, indium, tin, silver, palladium, osmium, iridium, ruthenium, titanium, magnesium, aluminum, cobalt, nickel, or zinc, or other metals or metal alloys.

A conductive terminal 105a, 105b may be further disposed between the first substrate 101 and the second substrate 103. The conductive terminal 105a, 105b may be disposed between the first pad 115a, 115b of the first substrate 101 and the corresponding first pad 117a, 117b of the second substrate 103. The conductive terminal 105a, 105b may electrically bond the first substrate 101 to the second substrate 103. In some embodiments, the conductive terminal 105a, 105b electrically bonds the first substrate 101 to the second substrate 103 by connecting to the first pad 115a, 115b of the first substrate 101 and to the corresponding first pad 117a, 117b of the second substrate 103. The conductive terminal 105a, 105b may be a pillar or a solder/stud bump. In some embodiments, the conductive terminal 105a, 105b is a solder bump.

The barrier structure 107a, 107b may be disposed adjacent to the first surface 101a of the first substrate 101. In some embodiments, the barrier structure 107a, 107b is disposed on (e.g., physical contact) the first surface 101a of the first substrate 101. The barrier structure 107a, 107b may be disposed adjacent to the electrical connection area 114 of the first surface 101a of the first substrate 101. The barrier structure 107a, 107b may surround the electrical connection area 114 of the first surface 101a of the first substrate 101. The barrier structure 107a, 107b may be disposed adjacent to at least one second pad 113a, 113b disposed in the electrical connection area 114. The barrier structure 107a, 107b may surround at least one second pad 113a, 113b disposed in the electrical connection area 114. The barrier structure 107a, 107b may be disposed adjacent to an edge (or the side surface 101c) of the first substrate 101. The barrier structure 107a, 107b may be disposed along the edge (or the side surface 101c) of the first substrate 101. In some embodiments, the barrier structure 107a, 107b is disposed at the periphery of the first substrate 101. In some embodiments, the barrier structure 107a, 107b is disposed adjacent to the cutting edge for individualizing the semiconductor package 100. In some embodiments, the barrier structure 107a, 107b is disposed on the first surface 101a of the first substrate 101 and spaced from the edge (or the side surface 101c) of the first substrate 101 by a distance D. In some embodiments, the barrier structure 107a, 107b is disposed adjacent to the edge (or the side surface 101c) of the first substrate 101 as closer as possible (i.e., the distance D is small) so that the first substrate 101 may have more space available in the first surface 101a and accommodate more elements. In some embodiments, the barrier structure 107a, 107b is disposed at the edge (or the side surface 101c) of the first substrate 101), such as having a side surface in substantially coplanar with the edge (or the side surface 101c) of the first substrate 101) (i.e., the distance D is about zero).

By disposing the barrier structure 107a, 107b to surround the electrical connection area 114 of the first surface 101a of the first substrate 101, it may prevent a molding material (e.g., a molding compound and a filler) flux from flushing to, overflowing, bleeding or flooding the electrical connection area 114 and hindering the electrical connection of the first substrate 101. Accordingly, the electrical connection of the first surface 101a of the first substrate 101 may be protected from the contamination of overflowing molding materials. The barrier structure 107a, 107b may include, for example, a photoresist material (e.g., polyimide (PI)), a polymeric material (e.g., benzocyclobutene (BCB)), or an epoxy.

A first molding layer 111 may be further disposed between the first substrate 101 and the second substrate 103. The first molding layer 111 may fill the space between the first substrate 101 and the second substrate 103. The first molding layer 111 may be disposed adjacent to the first surface 101a of the first substrate 101 and the first surface 103a of the second substrate 103. The first molding layer 111 may cover at least a portion of the first surface 101a of the first substrate 101 and at least a portion of the first surface 103a of the second substrate 103. The first molding layer 111 may cover at least a portion of the first surface 101a of the first substrate 101 and reach the barrier structure 107a, 107b, and covers at least a portion of the first surface 103a of the second substrate 103. The first molding layer 111 may extend from the first surface 103a of the second substrate 103 to the side surface 101c of the first substrate 101. The first molding layer 111 may extend from the first surface 103a of the second substrate 103 to the barrier structure 107a, 107b. The first molding layer 111 may not extend over the barrier structure 107a, 107b. In some embodiments, the first molding layer 111 surrounds the first substrate 101. In some embodiments, the first molding layer 111 surrounds the barrier structure 107a, 107b.

The first molding layer 111 may surround the conductive terminal 105a, 105b disposed between the first substrate 101 and the second substrate 103. The first molding layer 111 may encapsulate the conductive terminal 105a, 105b. In some embodiments, the first molding layer 111 surrounds the side surface 101c of the first substrate 101 and encapsulates the conductive terminal 105a, 105b, and covers at least a portion of the first surface 103a of the second substrate 103. In some embodiments, the first molding layer 111 covers at least a portion of the first surface 101a of the first substrate 101, encapsulates the conductive terminal 105a, 105b, and covers at least a portion of the first surface 103a of the second substrate 103. In some embodiments, the first molding layer 111 surrounds the barrier structure 107a, 107b and encapsulates the conductive terminal 105a, 105b, and covers at least a portion of the first surface 103a of the second substrate 103. In some embodiments where at least one electronic component 102a, 102b is disposed adjacent to the second surface 101b of the first substrate 101, the first molding layer 111 may surround the electronic component 102a, 102b and the conductive terminal 105a, 105b. In some embodiments, the first molding layer 111 encapsulates the electronic component 102a, 102b and the conductive terminal 105a, 105b. The first molding layer 111 may include, for example, a molding compound and a filler.

Figure 2:
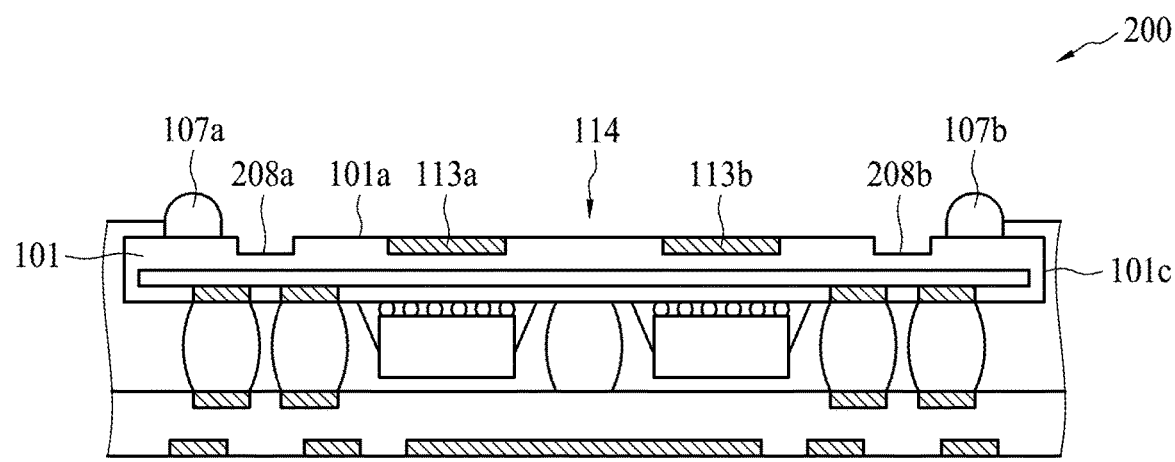
FIG. 2 illustrates a cross-sectional view of a semiconductor package according to some embodiments of the present disclosure.

FIG. 2 illustrates a cross-sectional view of a semiconductor package 200 according to some embodiments of the present disclosure. The semiconductor package 200 illustrated in FIG. 2 is similar to that illustrated in FIG. 1 with a difference including that a recess 208a, 208b may be further disposed adjacent to the first surface 101a of the first substrate 101.

The recess 208a, 208b may be disposed adjacent to the barrier structure 107a, 107b. The recess 208a, 208b may be disposed between the barrier structure 107a, 107b and the electrical connection area 114 of the first surface 101a of the first substrate 101. The recess 208a, 208b may be disposed adjacent to at least one second pad 113a, 113b disposed in the electrical connection area 114. The recess 208a, 208b may surround the electrical connection area 114. The recess 208a, 208b may surround at least one second pad 113a, 113b disposed in the electrical connection area 114. In some embodiments, the barrier structure 107a, 107b surrounds the recess 208a, 208b.

The recess 208a, 208b may be disposed adjacent to an edge (or the side surface 101c) of the first substrate 101. The recess 208a, 208b may surround the barrier structure 107a, 107b. In some embodiments, the recess 208a, 208b is disposed at the periphery of the first substrate 101. In some embodiments, the recess 208a, 208b is disposed adjacent to the cutting edge for individualizing the semiconductor package 200.

By disposing the recess 208a, 208b adjacent to the barrier structure 107a, 107b, it may assist the barrier structure 107a, 107b to prevent a molding material (e.g., a molding compound and a filler) flux from flushing to, overflowing, bleeding or flooding the electrical connection area 114 and hindering the electrical connection of the first substrate 101. Specifically, the barrier structure 107a, 107b may be useful in preventing overflowing of a molding compound and the recess 208a, 208b may be useful in prevent overflowing of a filler. Accordingly, the electrical connection of the first surface 101a of the first substrate 101 may be further protected from the contamination of overflowing molding materials.

Figure 3:
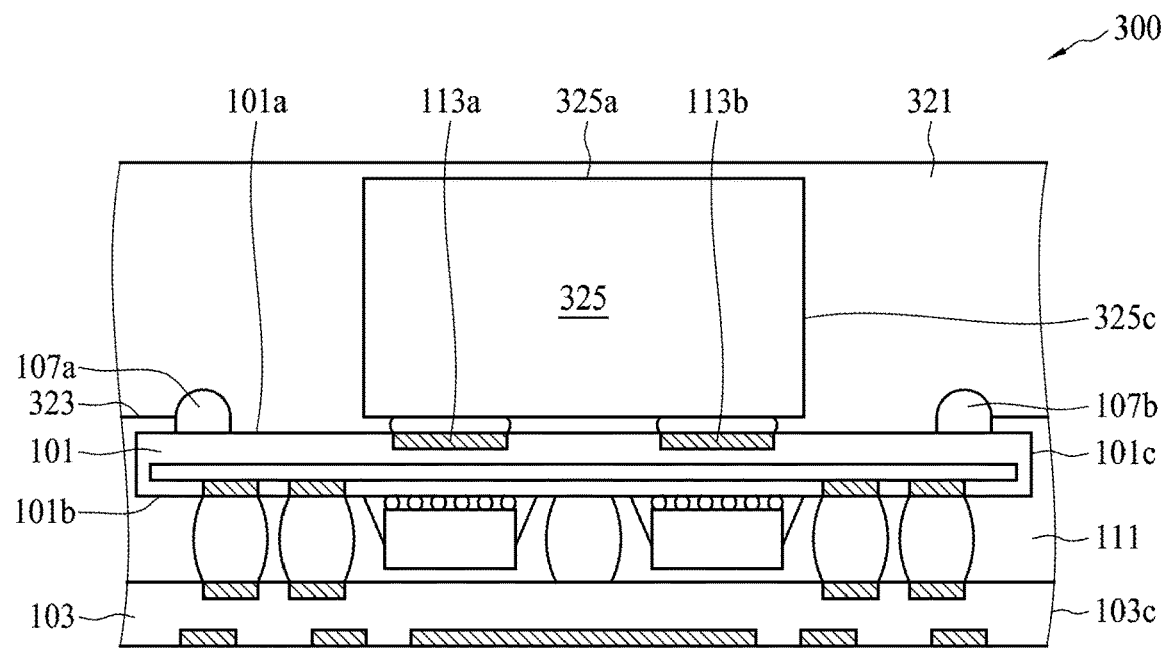
FIG. 3 illustrates a cross-sectional view of a semiconductor package according to some embodiments of the present disclosure.

FIG. 3 illustrates a cross-sectional view of a semiconductor package 300 according to some embodiments of present disclosure. The semiconductor package 300 illustrated in FIG. 3 is similar to that illustrated in FIG. 1 with a difference including that at least one second electronic component 325 and a second molding layer 321 may be further disposed adjacent to the first surface 101a of the first substrate 101.

The second electronic component 325 may be disposed adjacent to the electrical connection area 114 of the first substrate 101. The second electronic component 325 may electrically connect to the first surface 101a of the first substrate 101. In some embodiments, the second electronic component 325 electrically connects to the first surface 101a of the first substrate 101 through an electrical connector (e.g., a pillar or a solder/stud bump) connecting to the second pad 113a, 113b disposed in the electrical connection area 114 of the first substrate 101. The second electronic component 325 may include an active component (e.g., a die or a chip) and a passive component (e.g., a capacitor, an inductor, or a resistor). In some embodiments, at least one passive component 325 is disposed adjacent to the first surface 101a of the first substrate 101. In some embodiments, at least one active component is disposed adjacent to the first surface 101a of the first substrate 101. In some embodiments, at least one passive component 325 and at least one active component are disposed adjacent to the first surface 101a of the first substrate 101.

The second molding layer 321 may cover at least a portion of the side surface 101c of the first substrate 101 and at least a portion of the first surface 101a of the first substrate 101. The second molding layer 321 may cover at least a portion of the side surface 101c of the first substrate 101 and at least a portion of a side surface 325c of the second electronic component 325. The second molding layer 321 may cover at least a portion of the side surface 101c of the first substrate 101, at least a portion of the barrier structure 107a, 107b, and at least a portion of a side surface 325c of the second electronic component 325. The second molding layer 321 may cover at least a portion of the barrier structure 107a, 107b and at least a portion of a side surface 325c of the second electronic component 325. The second molding layer 321 may surround the barrier structure 107a, 107b and the second electronic component 325. The second molding layer 321 may cover at least a portion of the side surface 101c of the first substrate 101 and at least a portion of the first surface 325a of the second electronic component 325. The second molding layer 321 may extend from the side surface 101c of the first substrate 101 to the first surface 325a of the second electronic component 325. The second molding layer 321 may cover the side surface 325c and the first surface 325a of the second electronic component 325 entirely (e.g., the second electronic component 325 is embedded in the second molding layer 321). The second molding layer 321 may extend from the side surface 101c of the first substrate 101 to the side surface 325c of the second electronic component 325. The second molding layer 321 may cover at least a portion of the side surface 101c of the first substrate 101 and at least a portion of the side surface 325c of the second electronic component 325, and exposes at least a portion of the first surface 325a of the second electronic component 325. At least a portion of the first surface 325a of the second electronic component 325 may be exposed by the second molding layer 321 and attached to a heat sink to improve heat dissipation.

The second molding layer 321 may connect to the first molding layer 111 at an interface 323. The interface 323 may be substantially equal to or below the barrier structure 107a, 107b. The interface 323 may be within the range from the second surface 101b of the first substrate 101 to a top portion of the barrier structure 107a, 107b. The interface 323 may be within the range from the second surface 101b of the first substrate 101 to the first surface 101a of the first substrate 101. The interface 323 may be within the range from the first surface 101a of the first substrate 101 to the top portion of the barrier structure 107a, 107b. The interface 323 may be within the height of the barrier structure 107a, 107b. In some embodiments, the barrier structure 107a, 107b is in contact with the first molding layer 111 and the second molding layer 321. The second molding layer 321 may include, for example, a molding compound and a filler.

Figure 4:
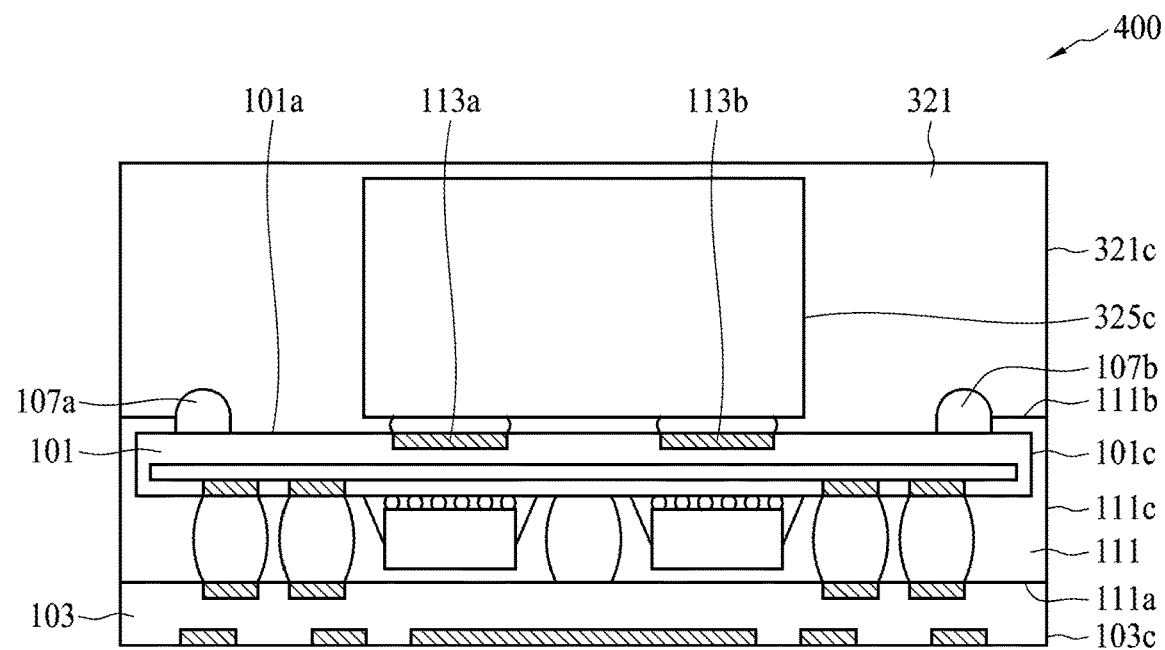
FIG. 4 illustrates a cross-sectional view of a semiconductor package according to some embodiments of the present disclosure.

FIG. 4 illustrates a cross-sectional view of a semiconductor package 400 according to some embodiments of the present disclosure. The semiconductor package 400 illustrated in FIG. 4 is similar to that illustrated in FIG. 3 with a difference including that the semiconductor package 400 is obtained by individualizing the semiconductor package 300 of FIG. 3.

A side surface 321c of the second molding layer 321, a side surface 111c of the first molding layer 111, and a side surface 103c of the second substrate 103 may be substantially coplanar. The side surface 103c of the second substrate 103 may be exposed from the first molding layer 111. The side surface 101c of the first substrate 101 may be covered or exposed by the first molding layer 111. In some embodiments, the side surface 101c of the first substrate 101 is covered by the first molding layer 111. In some embodiments, the side surface 101c of the first substrate 101 is exposed by the first molding layer 111. The side surface 101c of the first substrate 101 may be exposed by the first molding layer 111 because the first substrate 101 is long or wide enough so that it may still have sufficient length to be coplanar with the side surface 321c of the second molding layer 321 after a singularizing process (e.g., a sawing process) is performed. This extra space may allow the first substrate 101 to accommodate more traces, electrical connectors, and electronical components compared to that without exposed side surface 101c because of its shorter length or width.

In some embodiments, the side surface 101c of the first substrate 101 is covered by the first molding layer 111 and the side surface 103c of the second substrate 103 is exposed from the first molding layer 111. In some embodiments, both of the side surface 101c of the first substrate 101 and the side surface 103c of the second substrate 103 are exposed from the first molding layer 111.

Figure 5A:
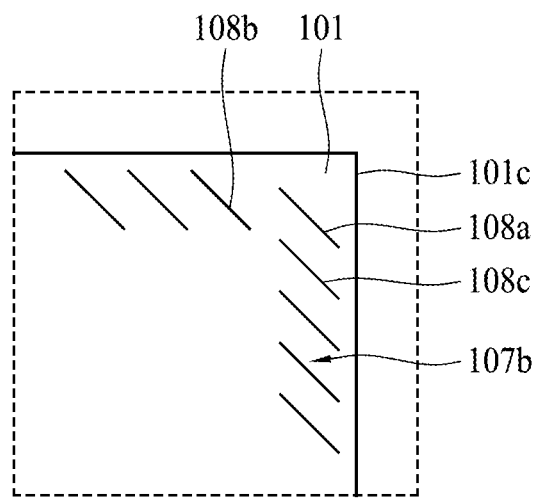
FIG. 5(a) illustrates a top view of a barrier structure of a semiconductor package according to some embodiments of the present disclosure.

FIG. 5(a) illustrates a top view of a barrier structure of a semiconductor package according to some embodiments of the present disclosure.

The barrier structure 107b may be disposed adjacent to an edge (or the side surface 101c) of the first substrate 101. The barrier structure 107b may be disposed along the edge (or the side surface 101c) of the first substrate 101. The barrier structure 107b may be a single wall disposed along the edge (or the side surface 101c) of the first substrate 101 or include at least one wall 108a, 108b, 108c. The walls 108a, 108b, 108c may be spaced from each other by a distance. The walls 108a, 108b, 108c may be disposed toward the same direction or different direction. The walls 108a, 108b, 108c may be parallel to each other. In some embodiments, the walls 108a, 108b, 108c are disposed toward the same direction so that a molding material (e.g., a molding compound and a filler) flux cannot flow through the walls 108a, 108b, 108c easily. Accordingly, it may further assist the barrier structure 107b to prevent from overflowing of a molding material.

Figure 5B:
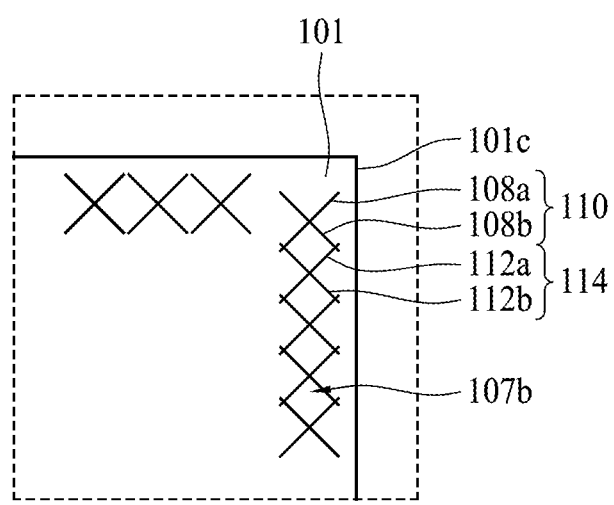
FIG. 5(b) illustrates a top view of a barrier structure of a semiconductor package according to some embodiments of the present disclosure.

FIG. 5(b) illustrates a top view of a barrier structure of a semiconductor package according to some embodiments of the present disclosure.

The barrier structure 107b may be disposed adjacent to an edge (or the side surface 101c) of the first substrate 101. The barrier structure 107b may be disposed along the edge (or the side surface 101c) of the first substrate 101. The barrier structure 107b may include at least one group of walls 110, 114. Each group of walls 110, 114 may be disposed next to each other. Each group of walls 110, 114 may include at least two walls 108a, 108b, 112a, 112b toward different directions so that a molding material (e.g., a molding compound and a filler) flux cannot flow through the walls 108a, 108b, 112a, 112b easily. Accordingly, it may further enhance the hindering effect of the barrier structure 107b. The walls 108a, 108b, 112a, 112b in each group 110, 114 may intersect at a certain point. Alternatively, the walls 108a, 108b, 112a, 112b in each group 110, 114 may not intersect at a certain point. In some embodiments, the walls 108a, 108b, 112a, 112b in each group 110, 114 intersect. The walls 108a, 108b, 112a, 112b in each group 110, 114 may be vertical to each other. In some embodiments, the walls 108a, 108b, 112a, 112b in each group 110, 114 intersect and form a right angle (e.g., an X-like configuration). In some embodiments, at least one of the groups of walls 110, 114 include intersecting walls 108a, 108b and at least one of the groups of walls 110, 114 include parallel walls (e.g., the walls illustrated in FIG. 5(a)). In some embodiments, all of the groups of walls 110, 114 include intersecting walls 108a, 108b, 112a, 112b.

FIGS. 6A-6E illustrate a method of manufacturing a semiconductor package such as the semiconductor package of FIG. 3 and FIG. 4.

Figure 6A:
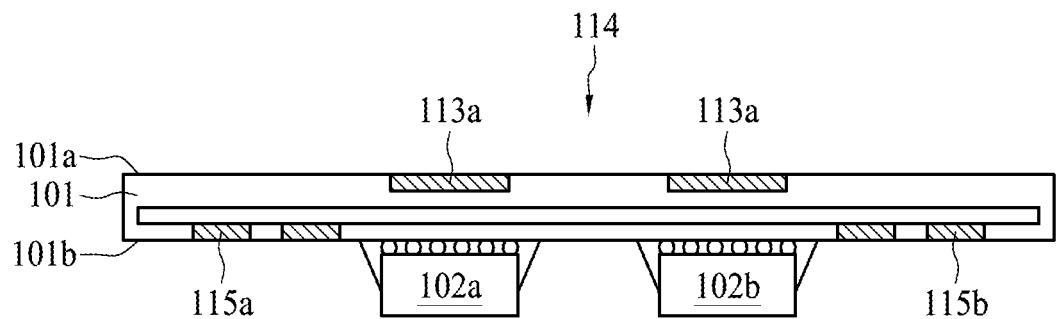
FIG. 6A, FIG. 6B, FIG. 6C, FIG. 6D, and FIG. 6E illustrate a method for manufacturing a semiconductor package such as the semiconductor package of FIG. 3 and FIG. 4.

Referring to FIG. 6A, a first substrate 101 is provided. The first substrate 101 has a first surface 101a and a second surface 101b opposite to the first surface 101a. The first substrate 101 may be a unit substrate. The first substrate 101 may include at least one first pad 115a, 115b disposed adjacent to the second surface 101b of the first substrate 101 and at least one second pad 113a, 113b disposed adjacent to the first surface 101a of the first substrate 101. At least one first electronic component 102a, 102b may be disposed adjacent to the second surface 101b of the first substrate 101. The first electronic component 102a, 102b may include an active component (e.g., a die or a chip) and a passive component (e.g., a capacitor, an inductor, or a resistor). In some embodiments, the first electronic component 102a, 102b is an active component.

Figure 6B:
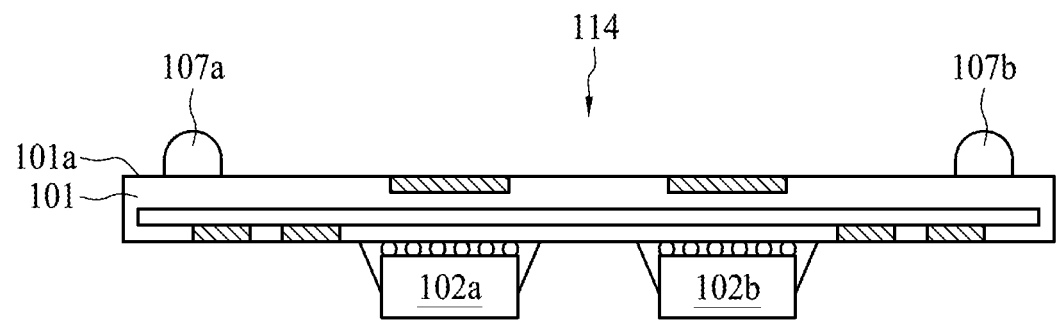

Referring to FIG. 6B, a barrier structure 107a, 107b is disposed adjacent to the first surface 101a of the first substrate 101. The barrier structure 107a, 107b may be formed by, for example, a photoresist technique, an etching technique, a spraying technique, a coating technique, an ink jetting technique, or a combination thereof.

Figure 6C:
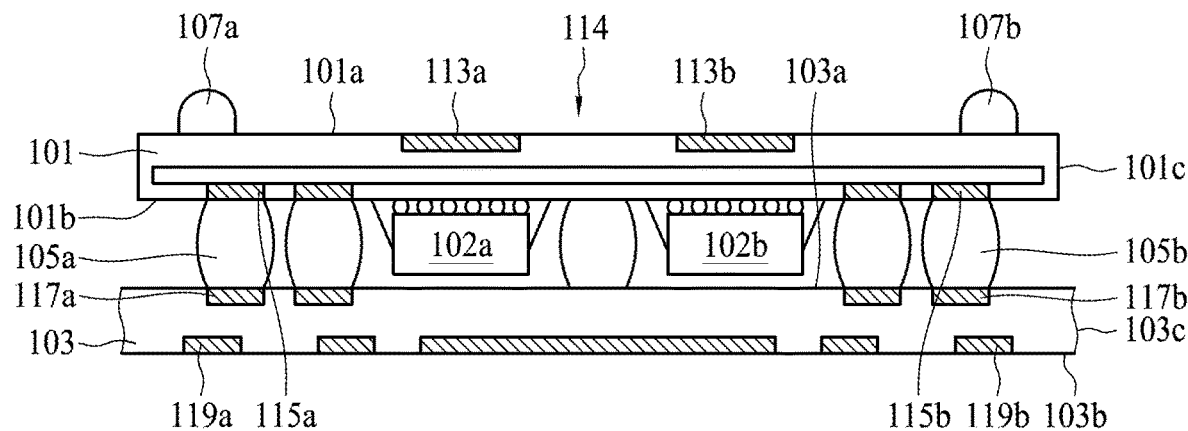

Referring to FIG. 6C, the first substrate 101 electrically bonds to a second substrate 103 through a conductive terminal 105a, 105b. The conductive terminal 105a, 105b may connect the first pad 115a, 115b of the first substrate 101 to the corresponding first pad 117a, 117b of the second substrate 103.

Figure 6D:
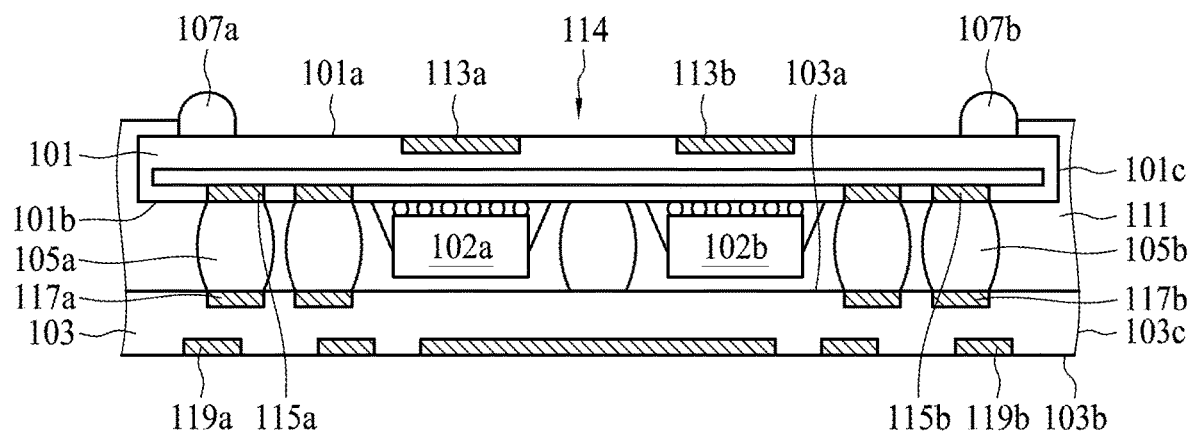

Referring to FIG. 6D, a first molding process is performed to form a first molding layer 111 disposed between the first substrate 101 and the second substrate 103.

Figure 6E:
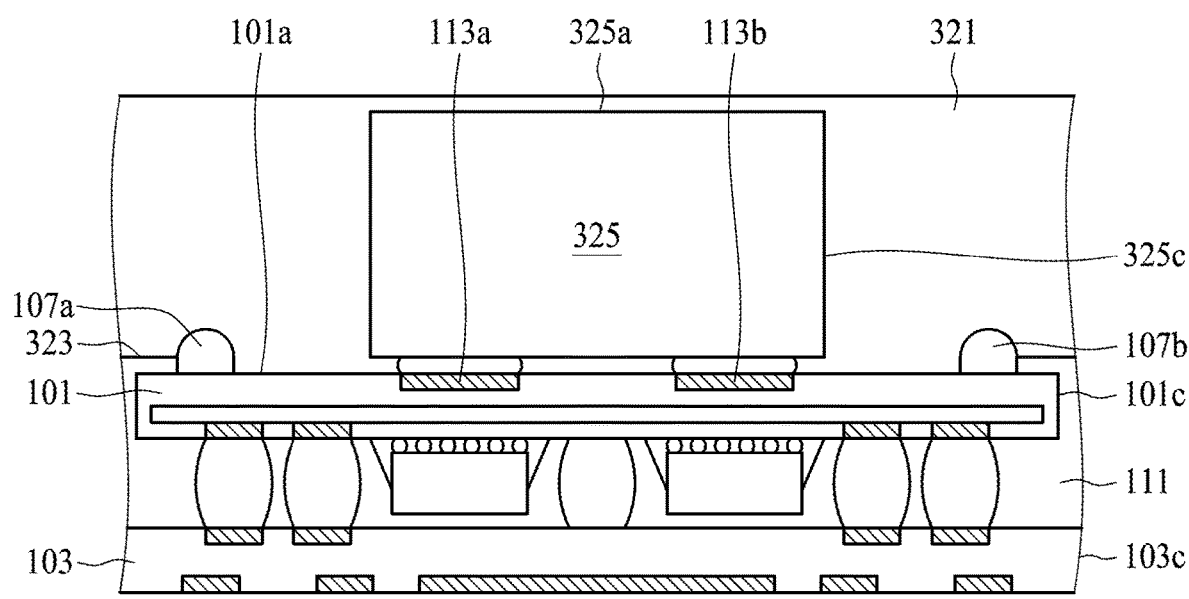

Referring to FIG. 6E, a second electronic component 325 is disposed adjacent to the electrical connection area 114 of the first substrate 101. The second electronic component 325 may include an active component (e.g., a die or a chip) and a passive component (e.g., a capacitor, an inductor, or a resistor). In some embodiments, the second electronic component 325 is a passive component. Subsequently, a second molding process is performed to form a second molding layer 321 covering the first substrate 101 and the second electronic component 325. The second electronic component 325 may be embedded in the second molding layer 321. The second electronic component 325 may be covered by the second molding layer 321 with an exposed first surface 325a of the second electronic component 325. Subsequently, a semiconductor package (e.g., a semiconductor device 300 as is illustrated in FIG. 3) may be obtained. If a singularizing process (e.g., a sawing process) is performed, a semiconductor package (e.g., a semiconductor device 400 as is illustrated in FIG. 4) may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
  a first substrate, having a first surface and a second surface opposite to the first surface;
  a second substrate, having a first surface facing the second surface of the first substrate, wherein the first substrate electrically bonds to the second substrate through a conductive terminal disposed between the second surface of the first substrate and the first surface of the second substrate;
  a barrier structure disposed adjacent to the first surface of the first substrate;
  a first molding layer disposed between the first substrate and the second substrate, wherein the first molding layer extends from the first surface of the second substrate to the first surface of the first substrate and covers at least a portion of the first surface of the first substrate; and
  a second molding layer disposed adjacent to the first surface of the first substrate,
  wherein the first molding layer connects to the second molding layer at an interface, wherein the interface is within the range from the first surface of the first substrate to a top portion of the barrier structure.

2. The semiconductor package of claim 1, wherein the barrier structure surrounds an electrical connection area of the first surface of the first substrate.

3. The semiconductor package of claim 1, wherein the first molding layer extends from the first surface of the second substrate to a side surface of the first substrate.

4. The semiconductor package of claim 1, wherein the first molding layer reaches the barrier structure.

5. The semiconductor package of claim 1, wherein the first substrate has a projection area smaller than that of the second substrate.

6. The semiconductor package of claim 5, wherein the interface is within the range from the second surface of the first substrate to the top portion of the barrier structure.

7. The semiconductor package of claim 1, further comprising a recess disposed adjacent to the first surface of the first substrate and adjacent to the barrier structure.

8. The semiconductor package of claim 7, wherein the barrier structure surrounds the recess.

9. The semiconductor package of claim 1, wherein a side surface of the first substrate and a side surface of the second substrate are exposed from the first molding layer.

10. The semiconductor package of claim 1, wherein the interface is substantially equal to or below the barrier structure.

11. The semiconductor package of claim 1, further comprising a first electronic component disposed adjacent to the second surface of the first substrate and a second electronic component disposed adjacent to the first surface of the first substrate.

12. The semiconductor package of claim 1, wherein the barrier structure is disposed adjacent to an edge of the first substrate.

13. The semiconductor package of claim 1, wherein the barrier structure is disposed along an edge of the first substrate.

14. The semiconductor package of claim 1, wherein the barrier structure comprises a plurality of walls toward the same direction.

15. The semiconductor package of claim 1, wherein the barrier structure is a single wall.

16. The semiconductor package of claim 7, wherein the recess is disposed between the barrier structure and an electrical connection area of the first surface of the first substrate.

* * * * *